United States Patent [19]
Kurmis

[11] Patent Number: 5,529,269
[45] Date of Patent: Jun. 25, 1996

[54] CABLE HARNESS LAYING DEVICE

[75] Inventor: Viktor Kurmis, Pinneberg, Germany

[73] Assignee: Paul Hellermann GmbH, Pinneberg, Germany

[21] Appl. No.: 244,006

[22] PCT Filed: Nov. 6, 1992

[86] PCT No.: PCT/EP92/02542

§ 371 Date: May 12, 1994

§ 102(e) Date: May 12, 1994

[87] PCT Pub. No.: WO93/10541

PCT Pub. Date: May 27, 1993

[30] Foreign Application Priority Data

Nov. 15, 1991 [DE]  Germany .......................... 91 14 276 U

[51] Int. Cl.⁶ .................................................. F16M 13/00
[52] U.S. Cl. ............................ 248/68.1; 248/49; 248/600
[58] Field of Search .......................... 248/68.1, 49, 74.2, 248/80, 316.8, 520, 600, 602, 548, 900

[56] References Cited

U.S. PATENT DOCUMENTS

| | | | |
|---|---|---|---|
| 4,029,277 | 6/1977 | Bulanda | 248/74 R |
| 4,337,934 | 7/1982 | Caveney | 269/77 |
| 4,566,502 | 1/1986 | Kellogg | 140/92.1 |

FOREIGN PATENT DOCUMENTS 2246087  1/1992  United Kingdom .

OTHER PUBLICATIONS

IBM Disclosure Bulletin May 1986 vol. 28 No. 12 pp. 5607–5610.

*Primary Examiner*—Karen J. Chotkowski
*Attorney, Agent, or Firm*—Michael, Best & Friedrich

[57] ABSTRACT

A cable harness laying device for fastening on a laying shelf to position a cable harness. The cable harness laying device comprises at least two columns fastened to the laying shelf and extending from the laying shelf, a bridge spaced from the laying shelf and extending between the columns, a generally elongated holding finger disposed on each of the columns and extending away from the laying shelf beyond the bridge, the holding fingers each being movable relative to their respective column in the direction of their elongation, a generally U-shaped channel defined by the holding fingers and the bridge, wherein the channel houses the cable harness, and a spring connection for each of the holding fingers biasing the holding fingers away from the bridge to a use position, the holding fingers being movable relative to their respective column away from the use against the bias of the spring connection.

2 Claims, 1 Drawing Sheet

CABLE HARNESS LAYING DEVICE

In electrical plants having a large number of connecting cables, it is usual to amalgamate these cables into cable harnesses, as they are known, and to pre-manufacture these for the purpose of easier assembly. For the premanufacture, a laying device is used which exhibits, on a bench-like laying shelf, as it is known, a plurality of mountings which are open at the top and into which the cables are inserted and by which the cable harness, especially at branches and bends, is held in the predetermined position. If all individual cables are gathered together in the device to form the cable harness, the cable harness is laced at a number of points by means of cable binders and removed from the laying device.

Known laying devices exhibit U-shaped holders, which are formed by two holding fingers fastened to a common column, the upper end of the column, at the base of the two holding fingers, forming a support for the cable harness, which is raised from the laying shelf so that a distance which is necessary for the engagement of a binding tool, is left between the cable harness and the cable shelf. At the points where the cable harness changes its laying direction, holders are used, the U-opening of which is laterally directed, the upper one of the holding fingers, which in this case are horizontally disposed, being able to be swung out upwards in order to simplify the removal of the cable harness. Yet other holders have the form of simple nails or pins, which are hammered into the laying shelf and likewise serve for the lateral limitation of the cable harness position. (Source of this prior art: Prospectuses of the companies Panduit Corp. and Thomas & Betts).

For the lacing of cable harnesses by means of cable binders, lacing tools are used, which comprise an arm-thick tool body and, at the front end of this, a narrow guide part which enclasps the cable harness in a pincer-like manner. The cable binders are readily placed as close as possible to branches or bends in the cable harness. These are also however precisely those points at which, in the laying device, a holder or holding finger is generally located. The cable binder should therefore desirably be placed as close as possible to such a holder or holding finger. The width of the tool body often proves to be an obstacle to this, since it makes it impossible to apply the narrow guide part directly next to a holder. For the bending region of a cable harness, U.S. Pat. No. 4,337,934 therefore proposes a holding finger which is displaceable in its longitudinal direction on a holding pin hammered into the laying shelf and which supports at its lower end a plate serving to support the cable harness. As soon as the cable harness is ready-moulded and is set to be laced, the finger, together with the plate, is lowered on the holding pin, so that the cable harness now lies exposed in this region and is accessible to a lacing tool. This known solution has the drawback that the support for the cable harness and its lateral limitation are lost whenever the holding finger is lowered. It demands therefore that the cable harness should be held rigidly in the proximity of the bend, namely by vertically inflexible holders on which there are disposed, in each case, a pair of clamps which are resiliently flexible transversely to the cable harness and the flexibility of which is dimensioned such that wires for the creation of the cable harness can be introduced between them and the finished cable harness removed between them (U.S. Pat. No. 4,029,277). The flexibility is not however sufficient to make the cable harness freely accessible to a lacing tool. This was manifestly not considered necessary in the region of the straight path of the cable harness, since it was felt that there was in any case sufficient space available there in which to fit the lacing point or arrange a column. Yet this overlooks the importance of branches, which can emanate from the straight path of the cable harness and at which both a column and a lacing point are readily provided. The object of the invention is to provide a cable harness laying device according to the preamble of Claim 1, which grants the cable harness a good and, even during the lacing operation, residual support and yet allows broadly free access to the lacing tool.

The solution according to the invention resides in the features of claim 1 and preferably in those of the subclaim.

The fact that a holder is used, the holding finger of which is deflectable in a direction running approximately transversely to the cable harness direction and is returned by spring force into the original setting, enables the tool to approach the holding finger such that the latter is dislodged from its position and thereby offers the tool the chance to reach places which would otherwise be refused it. Since the column of the cable harness is not connected to the deflecting holding finger but remains fixed during normal use, the cable harness support is maintained in the vertical direction even when an advanced lacing tool forces the holding finger to deflect.

The holding finger is displaceable in its longitudinal direction on or in a column to which it is fitted. In particular, the column can be of tubular construction, the holding finger being able to be slid telescopically into the column. This takes place against spring force, which returns the holding finger into its original position as soon as the force dislodging it comes to an end. The deflection motion of the holding finger in its own direction, i.e. mostly downwards in the direction of the laying shelf, is therefore particularly advantageous, since the binding tools are generally suspended above the laying shelf and are therefore advanced towards the cable harness from above.

The term 'holding finger' is intended, in the context of the invention, to embrace all devices which are used for the lateral limitation of the cable harness position. In a paired arrangement of the holding fingers, the cable harness support is formed by a bridge, which interconnects the columns fastened separately in each case to the laying shelf.

The invention is illustrated in greater detail below with reference to the illustrative embodiment represented in the drawing, in which.

Figure 1:
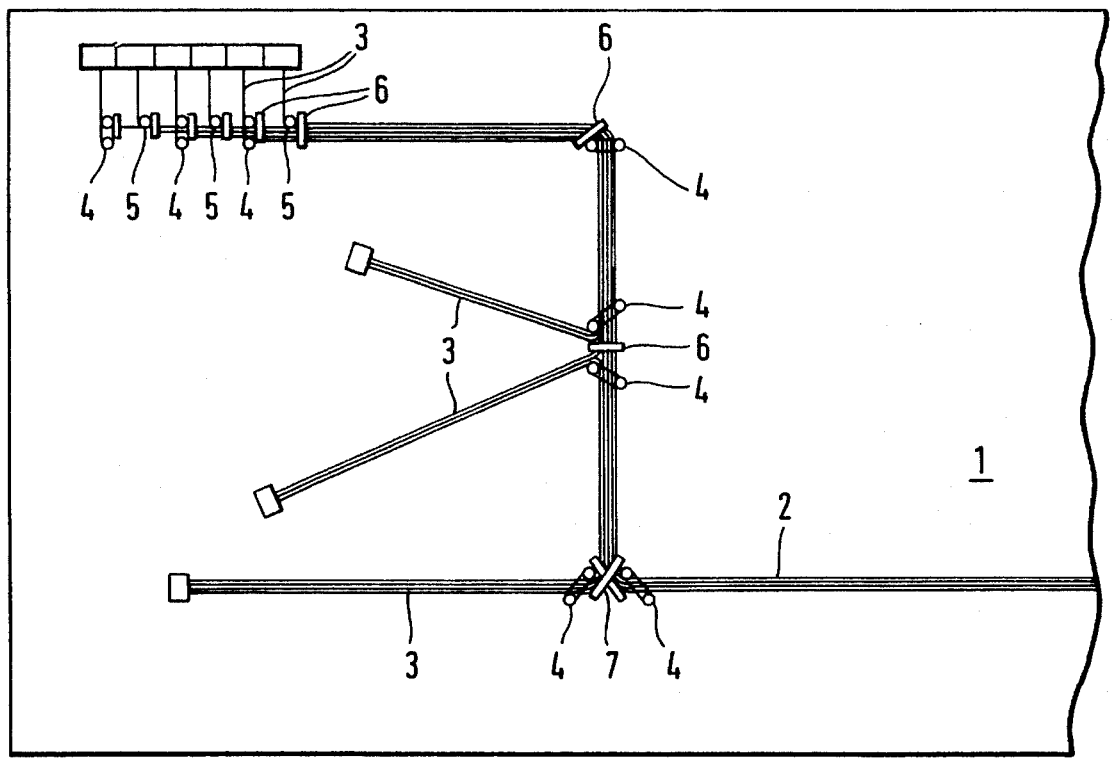
FIG. 1 shows a top view of a laying device.

The cable harness 2 with its branches 3 has to be laid on the laying shelf 1, which can but does not have to be horizontally disposed in the style of a bench. In order to secure the cables temporarily in the intended position, holders 4 are provided, which respectively enclasp two holding fingers on both sides of the cable harness. In addition, individual holding fingers are provided at 5 in the region of branches. It can be seen that the holders are primarily deployed wherever deviations and branches take place. The points at which cable binders 6 are to be placed can also be seen from FIG. 1, namely at the respective branches, the said cable binders also, in part, being doubly arranged as cross-binders 7.

Both the holders and the binders can only optimally discharge their function if they respectively work their way into the corners of the deviations and branches. The binders are therefore ideally located at the same place as the holders, virtually at the least possible distance from the latter.

Figure 2:
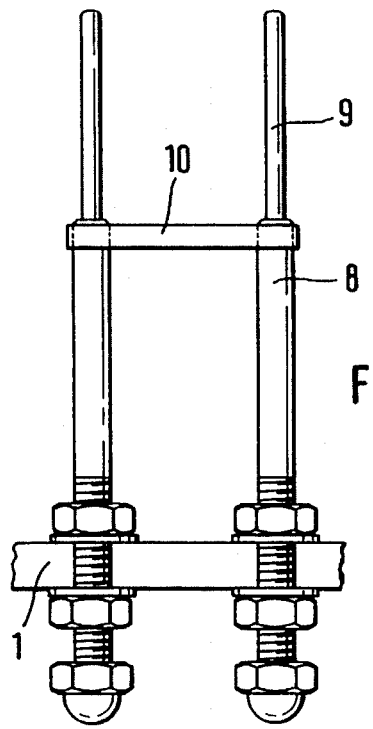
FIG. 2 shows a side view of two paired holding fingers.

In order to enable the binding tool to be applied in the direct vicinity of the holders, the holders have the construction which is apparent from FIG. 2. They comprise a column 8, which can be suitably fastened to the laying shelf 1, and the actual holding finger 9, which is guided telescopically in the tubular column 8 and can be slid into it against spring force.

The holders can be amalgamated into pairs, as is represented in FIG. 2. Although they are fastened separately to the laying shelf, they are nevertheless connected close to the upper end of the columns 8 by a bridge 10, which keeps them at that distance which is right for the particular thickness of the cable harness and forms, moreover, a support for the cable harness at a distance from the laying shelf 1. Bridges 10 are stocked in different lengths to enable account to be taken of different cable harness thicknesses. Hence each variant of upwardly open holders which is required in practice is able to be realized with just one type of holders or holding fingers and a plurality of bridges.

Figure 3:
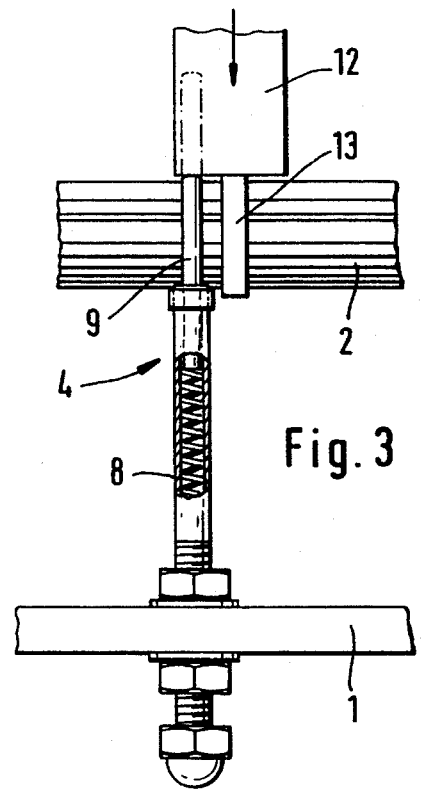
FIG. 3 shows a part-view of a cable harness in the laying device during the lacing operation.

FIG. 3 shows a cable harness 2 and a holder 4, comprising column 8 and holding finger 9, in side view. If a lacing is required to be performed directly alongside, then the tool 12 is advanced from above, the narrow band guide 13 which enclasps the cable harness 2 in a pincer-like manner having to be placed at the binding point directly next to the holder 4. This would be impossible if the holding finger 9 were to maintain its original setting indicated in dash-dot representation. Since, however, it can be slid telescopically into the column 8, it is able to be dislodged by the tool 12, which has been advanced from above and does not therefore form any obstacle to the lacing directly next to the holder 4. The cable harness support 10 herein maintains its position. There is therefore no fear of the cable harness becoming vertically deformed (transversely to the laying shelf) in the lacing region. Moreover, the cable harness remains laterally limited by the holding fingers 9, since these are dislodged only insofar as the tool is advanced. They are thus deflectable without their guide function being lost.

I claim:

1. Cable harness laying device having at least one holder which can be fastened on a laying shelf and is adapted to position a cable harness, characterized in that said holder comprises at least two columns fastened to said laying shelf and extending from said laying shelf, a bridge spaced from said laying shelf and extending between said columns, a generally elongated holding finger disposed on each of said columns and extending away from said laying shelf beyond said bridge, said holding fingers each being movable relative to their respective column in the direction of their elongation, a generally U-shaped channel formed on two sides by said holding fingers and on a third side by said bridge, wherein said channel houses the cable harness, and a spring connection for each of said holding fingers biasing said holding fingers away from said bridge to a use position, said holding fingers being movable relative to their respective column away from said use position against the bias of said spring connection.

2. The cable harness laying device of claim 1 wherein each of said holding fingers is mounted for telescopic movement on its respective column.

* * * * *